US007876866B1

(12) United States Patent  (10) Patent No.: US 7,876,866 B1
McAdam et al.  (45) Date of Patent: Jan. 25, 2011

(54) DATA SUBSET SELECTION ALGORITHM FOR REDUCING DATA-PATTERN AUTOCORRELATIONS

(75) Inventors: Matthew W. McAdam, Vancouver (CA); Jurgen Hissen, Port Moody (CA); Graeme Boyd, North Vancouver (CA)

(73) Assignee: PMC-Sierra US, Inc., Santa Clara, CA (US)

( * ) Notice: Subject to any disclaimer, the term of this patent is extended or adjusted under 35 U.S.C. 154(b) by 1310 days.

(21) Appl. No.: 11/339,554

(22) Filed: Jan. 26, 2006

Related U.S. Application Data

(60) Provisional application No. 60/647,010, filed on Jan. 27, 2005.

(51) Int. Cl.
*H03D 1/04* (2006.01)
(52) U.S. Cl. .................. 375/346; 375/229; 375/232; 375/233; 375/236; 375/220; 375/358
(58) Field of Classification Search .......... 375/229, 375/232, 233, 236, 346
See application file for complete search history.

(56) References Cited

U.S. PATENT DOCUMENTS

| 3,691,472 | A | * | 9/1972 | Bohman | 327/164 |
|---|---|---|---|---|---|
| 4,325,129 | A | * | 4/1982 | Groth, Jr. | 708/253 |
| 4,355,366 | A | * | 10/1982 | Porter | 708/255 |
| 5,208,665 | A | * | 5/1993 | McCalley et al. | 725/119 |
| 5,210,770 | A | * | 5/1993 | Rice | 375/142 |
| 5,233,635 | A | * | 8/1993 | Henriksson et al. | 375/346 |
| 5,852,630 | A | * | 12/1998 | Langberg et al. | 375/219 |
| 6,134,280 | A | * | 10/2000 | Matui | 375/341 |
| 6,570,864 | B1 | * | 5/2003 | Kim et al. | 370/342 |
| 6,643,374 | B1 | * | 11/2003 | Wells et al. | 380/47 |
| 6,947,960 | B2 | * | 9/2005 | Hars | 708/250 |
| 7,027,499 | B2 | * | 4/2006 | Peon et al. | 375/232 |
| 7,391,828 | B2 | * | 6/2008 | Liu et al. | 375/342 |
| 2004/0105512 | A1 | * | 6/2004 | Priotti | 375/340 |
| 2004/0234002 | A1 | * | 11/2004 | Yang et al. | 375/263 |
| 2005/0276356 | A1 | * | 12/2005 | Hui | 375/340 |
| 2006/0101054 | A1 | * | 5/2006 | Dempski et al. | 707/102 |
| 2008/0310484 | A1 | * | 12/2008 | Shattil | 375/146 |

* cited by examiner

*Primary Examiner*—Chieh M Fan
*Assistant Examiner*—Siu M Lee
(74) *Attorney, Agent, or Firm*—Curtis B. Behmann; Borden Ladner Gervais LLP

(57) ABSTRACT

A method and apparatus are provided for reducing, and preferably substantially eliminating, data-pattern autocorrelations found in digital communication systems. The method employed is referred to as Data Subset Selection (DSS) and is implemented in the form of DSS engine. Autocorrelations in the data-pattern can cause many digital adaptive systems to converge to an incorrect solution. For example, the LMS method, which is often used in adaptive filtering applications, can converge to an incorrect set of filter coefficients in the presence of data-pattern autocorrelations. Digital timing recovery methods are also susceptible. Other impairments that result from data-pattern autocorrelations include increased convergence time and increased steady-state chatter. DSS reduces, and preferably substantially eliminates, data-pattern autocorrelations by selecting a subset of the data stream that either demonstrates smaller autocorrelations or no autocorrelations, thus improving the performance of the aforementioned digital adaptive systems.

43 Claims, 13 Drawing Sheets

DATA SUBSET SELECTION ALGORITHM FOR REDUCING DATA-PATTERN AUTOCORRELATIONS

RELATED APPLICATIONS

The present invention claims priority from U.S. Provisional Patent Application Ser. No. 60/647,010 filed Jan. 27, 2005 and herein incorporated by reference in its entirety.

FIELD OF THE INVENTION

The present invention relates generally to data methods in digital communications systems. More particularly, the present invention relates to improved processing of a digital stream of bits where autocorrelation typically inhibits adaptive digital control methods.

BACKGROUND OF THE INVENTION

There are many digital control methods used in digital communication systems. The performance of such systems is usually measured in terms of Bit Error Rate (BER). Adaptive filtering and clock recovery are two common examples of digital control methods. Such digital control methods, or adaptation methods, can be found in many diverse fields including telecommunications (wireless and wireline), biomedical systems, industrial control, storage media, etc. Adaptive filtering in particular is a common and powerful function that finds use in a wide variety of applications. One such important application is the basic communication problem in which information has to be sent from one place to another. When the applied filter is used to compensate for the effects of the channel across which the information was sent, it is typically referred to as an equalizer. A major source of error in information transmission is intersymbol interference (ISI), which arises when a signal is sent across a dispersive channel. Dispersive channels tend to spread the energy of a transmitted signal out over time, which means both past and future symbols can interfere with the current symbol.

To further illustrate ISI, consider a transmitted signal, t, which is sent across a dispersive channel with impulse response h. The received signal, x, is given by:

$$x_k = \sum_n h_n t_{k-n} = h_0 t_k + \sum_{n<0} h_n t_{k-n} + \sum_{n>0} h_n t_{k-n} \qquad \text{Eqn 1}$$

The second term in Equation 1 arises from the precursor component of the channel impulse response, and allows future symbols to interfere with the current symbol. The third term in Equation 1 arises from the postcursor component of the channel impulse response, and allows previous symbols to interfere with the current symbol. Fortunately, equalization can be used to reduce or remove these components. However, one oftentimes has no prior knowledge of the channel characteristics, making it difficult to define the optimum filter. To overcome this problem, filters are often made adaptive, thus allowing them to "learn" the channel characteristics. The adaptive transversal filter is a fundamental component in adaptive equalization applications, and is a well-understood non-recursive structure. It operates in the discrete time domain and has a finite impulse response (FIR).

A generalized block diagram of a typical adaptive transversal filter is shown in FIG. 1. For convenience, the input history and coefficients are expressed as column vectors:

$$X_k = [x_k \, x_{k-1} \ldots x_{k-N}]^T \qquad \text{Eqn 2}$$

$$W_k = [w0_k \, w1_k \ldots wN_k]^T \qquad \text{Eqn 3}$$

where the superscript T denotes transpose. Coefficient adaptation is performed based on the desired response, $d_k$, and the filter output, $y_k$. The value $d_k$ is often a training (pilot) signal, which is essentially a copy of the transmitted sequence stored in the receiver, or the hard decisions of a Decision Feedback Equalizer (DFE). Commonly used adaptation methods attempt to minimize the mean-square error, $E[\epsilon_k^2]$, where the error signal is given by:

$$\epsilon_k = d_k - y_k = d_k - W_k^T X_k \qquad \text{Eqn 4}$$

Expanding the square of the error signal gives:

$$\varepsilon_k^2 = (d_k - W_k^T X_k)^2 \qquad \text{Eqn 5}$$
$$= d_k^2 + W_k^T X_k X_k^T W_k - 2 d_k X_k^T W_k$$

To produce a reasonably simplified expression for the mean-square error, the following assumptions can be made: $W_k$ is fixed; and $X_k$, $d_k$, and $e_k$ are statistically wide-sense stationary.

With these assumptions, the mean-square error reduces to:

$$E[\epsilon_k^2] = E[d_k^2] + W^T E[X_k X_k^T] W - 2E[d_k X_k^T] W \qquad \text{Eqn 6}$$

From Equation 6, it is clear that the mean-square error is a quadratic function of the coefficient vector W. This quadratic function is referred to as the error surface, and it contains a global minimum at the optimal coefficient vector. The task of the adaptation engine is to walk the coefficients down the error surface to a point as close as possible to the optimal solution (the global minimum). There are a variety of basic methods available to converge the coefficient vector to the optimal solution, including Newton's method, the steepest descent method, least-mean square (LMS) method, and recursive least squares (RLS) method. LMS is one of the most commonly used methods due to its ease of computation. LMS achieves its simplicity by approximating the mean-square error, $E[\epsilon_k^2]$, with $\epsilon_k^2$, leading to the following coefficient update equation:

$$W_{k+1} = W_k + \mu \epsilon_k X_k \qquad \text{Eqn 7}$$

In the Equation 7, $\mu$ is a step-size scalar that can be used to control convergence rate and steady-state accuracy.

In the above exemplary description, the filter and associated methods operate on real-valued data. The extension to complex-valued data and coefficients is well known in the art and should be understood as also included in the scope of the present disclosure. Similarly, in the exemplary description, the optimal coefficient vector is chosen as the one that minimizes the mean square error between the filter output and the desired response. When the desired response, $d_k$, is unknown, adaptation must be done in blind mode. There are many methods capable of blindly converging an adaptive filter, and they all make use of higher-order statistics of the filter's input. Some prominent methods include Sato's method and the Constant Modulus Algorithm (CMA).

An alternative to the feedforward transversal filter, known as the Decision Feedback Equalizer (DFE) has been known for several decades and includes improved performance to its linear counterpart. DFE was later modified to be adaptive. Adaptive DFEs typically use adaptive transversal filters in feedback, and sometimes feedforward, roles, as shown in FIG. 2. The role of the feedforward section is to reduce the precursor component of the ISI, while the feedback section reduces the postcursor component. In a traditional symbol-rate DFE, corrections are made for precursor and postcursor components spaced at integer multiples of the symbol period, T. For example, a DFE with N feedback taps can correct for postcursor components that occur at spacings of T, 2T, . . . , NT from the current symbol. DFEs can be implemented in analog or digital form. A digital implementation requires analog-to-digital conversion of the filter's input signal. DFEs are often operated in decision-directed mode, which uses the output of the decision device as the desired signal. In this case, the error signal is given by the difference between the decision device's output and input. This is advantageous, as it doesn't require a training signal to converge the adaptation engine, although convergence is inherently more difficult. A block diagram for a decision-directed DFE is shown in FIG. 3.

In FIG. 3, a common error signal and adaptation engine are used to adapt both feedforward and feedback sections. The generation of this error signal can be challenging, as in an analog implementation it is necessary to sample and hold and then scale the soft decisions (input of the decision device) before subtracting them from the hard decisions (output of the decision device). This makes sure the delay through the decision device is accounted for, and also prevents the hard decisions from swamping the small signal level of the soft decisions.

Fractionally Spaced Equalizers (FSEs) are transversal equalizers (used as a linear equalizer or the feedforward portion of a DFE) whose taps are spaced at some fraction of the symbol period. A typical choice is T/2 spacing, which allows correction of both the in-phase instant and the quadrature instant in the channel impulse response. For an ideal, jitter-free sampling clock, equalization of anything but the ideal in-phase sampling instant provides no improvement in performance. However, when a realistic, jittered clock is considered, the true sampling instant slides around the ideal point. Because of this, there is advantage in providing equalization across the entire symbol period. Thus in realistic systems, FSEs provide superior performance to symbol-rate equalizers.

Timing/clock recovery in digital communications systems is necessary when only data is transmitted across a channel. In this situation, recovering the data symbols from the distorted received signal requires sampling that data with a symbol-rate recovered clock. For good data recovery (low BERs), the phase of the recovered clock must be well placed (typically at the center of the received 'eye' shown by FIG. 4). In an ideal, infinite-bandwidth system, clock recovery would not be terribly important, as the received eye would be completely open. In other words, one could place the recovered clock phase at virtually any phase and expect to sample the correct data. However, in a realistic, band-limited system, the eye closes to an extent dependent on the channel, the additive noise, and other factors. In such instance, good data recovery can only be achieved with certain recovered clock phases. This is illustrated in FIG. 4.

In FIG. 4, the ISI caused by the channel has produced a multitude of received signal trajectories that vary in amplitude and time (the vertical and horizontal 'fuzz'). The approximate optimum phase for the recovered clock is identified by the arrow. The hatched area marks clock phases that would produce very high BERs; the horizontal width of this region is referred to as the "jitter" of the received signal. For a symmetrical eye, the optimum phase is 0.5 Unit Intervals (UI) away from the mean of the zero crossings, all of which occur in the hatched region. The ultimate goal of a clock recovery block is to lock the phase of the recovered clock as close as possible to the optimum phase. There are many methods of accomplishing this goal, some of which are analog in nature (e.g., phase locked loop (PLL) based recovery) and some of which are digital in nature (e.g., a symbol-rate early/late method). Virtually all these methods use an adaptive, closed-loop approach.

Digital clock recovery methods make use of samples of the received signal to find the optimum phase. The most common approaches use two clocks, an in-phase clock and a quadrature clock, which are offset from one another in phase by 0.5 UI. With the samples produced by these two clocks, the mean of the zero crossings can be determined. The in-phase clock is then placed 0.5 UI away from this position.

One known architecture for such a digital clock recovery system is shown in FIG. 5. ICLK and QCLK, two clocks offset by 0.5 UI, are used to create the in-phase and the quadrature samples respectively. These samples are processed by the Clock Recovery Adaptation Engine, which determines the phase of two clocks. The Adaptation Engine controls the Phase Interpolator, which takes a set of externally generated clocks and interpolates between them to achieve the desired phases for ICLK and QCLK. Another point to note is that the receiver and transmitter ends of a digital communication channel may be clocked with different references. In such instances, a frequency offset can exist and may require a more advanced Clock Recovery Adaptation Engine with a frequency compensation loop. This is a fairly common architecture, but it is merely one example of many.

It is a well-known problem that data-pattern autocorrelations can reduce the convergence rate of various adaptive methods, in particular the LMS method. Without autocorrelations, the method arrives at one solution in a certain period of time; with autocorrelations, it may arrive at a different solution and may take longer to arrive there. Autocorrelation is defined as the cross-correlation of a signal with itself over varying intervals of time or space. As such, autocorrelation may involve the expectation of the multiplication of two random variables, which are obtained by observing a single random process at different points in time:

$$R_x(\tau) = E[X(t)X(t+\tau)] \quad \text{Eqn 8}$$

In Equation 8, $R_x$ represents the autocorrelation, $X(t)$ the random process, and $\tau$ the time separation between the two observations. When operating in the discrete-time domain, this equation can be restated as:

$$R_x(n) = E[X_k X_{k+n}] \quad \text{Eqn 9}$$

Equation 9 can be easily applied to the digital communications problem: $X_k$ is a random variable representing the kth bit in the transmitted stream, and $X_{k+n}$ a random variable representing the bit sent n-bits later (or earlier if n is negative).

Consider a two-level digital communications system in which the transmitted bit sequence is perfectly random. That is, each bit has a 50% probability of being chosen a +1, 50% probability of being chosen a −1, and each bit is independent of all other bits. In this case, Equation 9 reduces to zero except for n=0. The autocorrelations are zero.

In most digital communications systems, the transmitted bit sequence is not random. Bits are related to one another. As a specific example, consider the following conditional probabilities:

$P(\text{next bit}=+1 | \text{current bit}=+1) = 0.25$ $P(\text{next bit}=+1 | \text{current bit}=-1) = 0.75$ $P(\text{next bit}=-1|\text{current bit}=+1)=0.75$ $P(\text{next bit}=-1|\text{current bit}=-1)=0.25$  Eqn 10

In this case, each bit depends on the previously transmitted bit. This is a basic example of data-pattern autocorrelation, for which Equation 9 would have a non-zero result when n=1 (along with n=0). If no autocorrelations were present in the bit stream, all the probabilities in Equation 10 would be 0.5.

Many attempts have been made to 'whiten' the received data to improve the performance of Adaptation Engines used in Adaptive Filtering applications—whitening is an alternate term for removing data-pattern autocorrelations. These attempts have largely focused on passing the data through linear filters. They are typically complex, require a great deal of additional computational overhead, and are imperfect in the quality of whitening they achieve. Many other known approaches attempt to measure the autocorrelations and do something with the information. For example, coefficients are only updated when the autocorrelation is deemed to be a low enough value. In other approaches, autocorrelations are estimated and that information is used to improve the system performance.

Clock Recovery applications exist that align the recovered clock phase based on a subset of the received data samples. Known approaches in this field are represented by the following public domain publications, each of which is incorporated by reference in its entirety: Douglas, S. C. et al. "Self-Whitening Methods for Adaptive Equalization and Deconvolution," Signal Processing, IEEE Transactions on [see also Acoustics, Speech, and Signal Processing, IEEE Transactions on], Volume: 47, Issue: 4, pp. 1161-1165, April 1999; Besbes, H. Ben Jebara, S. "The pre-whitened NLMS: a promising method for acoustic echo cancellation," Electronics, Circuits and Systems, 2002. 9th International Conference on, Volume: 3, 15-18, pp. 875-878, September 2002; Ting Liu, Gazor, S. "Decorrelated methods for faster adaptation," Signal Processing, 2002 6th International Conference on, Volume: 1, 26-30, pp. 301-304, August 2002; Japanese Patent Abstract 7321715A2: "Data Receiver," published Jan. 1, 2000; U.S. Pat. No. 5,414,699: "Method and apparatus for receiving and decoding communication signals in a CDMA receiver using partial de-correlation," issued May 9, 1995; U.S. Pat. No. 5,559,840: "Digital timing recovery method and apparatus for a coded data channel," issued Sep. 24, 1996.

There are many digital control methods used in digital communication systems, whose performance is measured in terms of Bit Error Rate (BER). Adaptive filtering and clock recovery are two common examples. As will be shown, these methods may be impaired by the presence of data-pattern autocorrelations.

Data-pattern autocorrelation is given by:

$R_x(n)=E[X_k X_{k+n}]$  Eqn 11

When data-pattern autocorrelation is not present, Equation 11 reduces to:

$R_x(0)=1$ $R_x(n)=0 \; n \neq 0$  Eqn 12

When data-pattern autocorrelations are present, one or more of the terms for which n≠0 is non-zero. Data-pattern autocorrelations can result from a number of factors, such as the use of coding or the transmission of a repeating sequence. Two examples will be used to demonstrate the impact of autocorrelations on adaptive digital methods. As a first example, consider a DFE with only a feedback transversal filter, which itself can be shown to be essentially equivalent to the configuration shown in the block diagram of FIG. 6.

As is the norm, assume that the equalizer is operating in near-lock (steady-state) conditions where the decision feedback filter input $t_{fb}$ is approximately equal to the original binary channel input data t (due to correct slicing at the decision device). In this case, it is well-known in the art that the performance of the feedback transversal filter in terms of convergence and steady-state error is dependent on the auto-correlation matrix of the binary source data x and that the more correlated the input data, the more non-ideal the performance of the filter. Eliminating or reducing these autocorrelations can improve the performance of such a DFE.

To illustrate this, consider a 2-tap, decision-directed DFE system that is adapted using the LMS method to cancel post-cursor ISI. Some important signals in such a system are: the first and second post-cursor coefficient weights, $W=[w_1 \; w_2]^T$, the transmitted data pattern, $t(t_k \in \{-1,+1\})$, and the channel impulse response, h. For an ideal channel, the pre and post-cursor interferers are zero, and the impulse response is given by $h=[\ldots 0 \; 0 \; h_0 \; 0 \; 0 \ldots]^T$. A bit $t_k$ transmitted through such a channel will result in the ideal received signal: $t_k * h_0$. However, in a realistic channel the pre and post-cursor terms in the impulse response are non-zero, leading to a deviation from the ideal received signal, which is represented by the error signal, $\epsilon$.

For simplicity, consider a channel with a single pre-cursor term and two post-cursor terms, yielding the following expression for the error signal:

$$\varepsilon_k = [t_{k+1} \; t_k \; t_{k-1} \; t_{k-2}] \begin{bmatrix} h_{-1} \\ h_0 \\ h_1 - w_1 \\ h_2 - w_2 \end{bmatrix} - t_k h_0$$

$$= [t_{k+1} \; t_{k-1} \; t_{k-2}] \begin{bmatrix} h_{-1} \\ h_1 - w_1 \\ h_2 - w_2 \end{bmatrix}$$

Eqn 13

The LMS coefficient update equation is given by:

$W_{k+1}=W_k+\mu \epsilon_k T_k$  Eqn 14

$T_k=[t_{k-1} \; t_{k-2}]$  Eqn 15 and the steady-state solution thereof requires the following:

$E[\epsilon_k t_{k-1}]=0$ $E[\epsilon_k t_{k-2}]=0$  Eqn 16

Then the steady-state solution of coefficient $w_1$ becomes:

$$E[[t_{k+1} \; t_{k-1} \; t_{k-2}] \begin{bmatrix} h_{-1} \\ h_1 - w_1 \\ h_2 - w_2 \end{bmatrix} t_{k-1}] = 0$$

Eqn 17

$h_{-1} E[t_{k+1} t_{k-1}] + (h_1 - w_1)E[t_{k-1}^2] + (h_2 - w_2 k)E[t_{k-2} t_{k-1}] = 0$  Eqn 18

The expected value of the middle term reduces to a value of 1. Using the notation of Equation 9, Equation 18 becomes:

$h_{-1} R_D(2) + (h_1 - w_1) + (h_2 - w_2) R_D(1) = $ Eqn 19

For an uncorrelated data pattern, $R_D(1)$ and $R_D(2)$ are zero, and Equation 19 reduces to the optimal solution: $w_1 = h_1$. For data pattern with autocorrelations, an error is introduced by h−1 and coupling is introduced between the two coefficients $w_1$ and $w_2$. The former causes steady state error, and the latter can result in slow adaptation.

As a second example, consider a digital clock recovery system that uses one of the digital control methods mentioned in a previous section. Data-pattern autocorrelations are detrimental to these methods, which can be demonstrated in an intuitive manner.

To begin this demonstration, consider the construction of a system with a low-pass channel characteristic. For such a channel, it is expected that the inner trajectories of the eye diagram (see FIG. 4) result from sections of the data pattern with high transition density, the extreme case of which is a [+1,−1,+1,−1,+1 . . . ] pattern. One would expect this because the higher transition density implies a higher frequency content, which is more significantly attenuated by the low-pass channel. The inner trajectories have zero-crossings that occur 'early' in the eye. The opposite is true low transition density sections.

In many of the digital clock recovery methods, the recovered clock phase is determined by finding the average zero-crossing point of the received signal. If the distribution of zero-crossings is altered, then the recovered clock phase can shift. For the case of an extended section of high transition density, the average zero crossing tends to shift earlier in the eye. This results in a sub-optimal recovered clock phase, which can lead to bit errors when the pattern shifts back to a low transition density region. The same impairment is caused by a long section of low transition density, except that the average zero crossing tends to shift to a point later in the eye. The concepts of high and low transition density regions are merely specific examples of data-pattern autocorrelations, though other types of data-pattern autocorrelations lead to similar effects.

Thus, it has been shown how data-pattern autocorrelations can impair two specific systems. However, they can also have detrimental effects on other digital systems, and the use of these examples is in no way intended to be limiting.

It is, therefore, desirable to provide an improved method and apparatus for reducing data pattern autocorrelation.

SUMMARY OF THE INVENTION

It is an object of the present invention to obviate or mitigate at least one disadvantage of previous digital control methods. The present invention seeks to reduce data pattern autocorrelations that would otherwise increase convergence time and introduce steady-state error in digital adaptive methods. The present invention seeks further to alleviate the problem of data-pattern autocorrelations reducing the convergence rate of various adaptive methods, in particular the LMS method. The present invention seeks to also reduce problems within practical implementations where data pattern autocorrelation often results in the digital adaptive method converging to the incorrect solution. The various embodiments of the present invention can be considered as a nonlinear filtering of the received data, which may perform very good, substantially perfect, whitening with a very small computational overhead.

A modified LMS method according to embodiments of the present invention provides a powerful, yet readily implementable tool to help adaptation engines overcome even non-static data-pattern autocorrelations. These autocorrelations are detrimental to the performance of digital communications systems. Providing a generic, low-cost solution to deal with the problem is of commercial significance.

According to one aspect of the present invention, there includes an apparatus for reducing sensitivity of a digital communication system block to data-pattern autocorrelations, the apparatus including: a delay block for separating n-bit spaced subsets of the digital stream of bits, where n is an integer; a set of detector blocks for accepting the n-bit spaced subsets of the digital stream of bits; a detector controller for controlling the set of detector blocks to determine bit combinations; and a logic gate for enabling the adaptation engine upon a predetermined output of the set of detector blocks.

According to another aspect of the present invention, there includes a method of processing a digital stream of bits receiving a bit stream, the method including: selecting a subset of the bit stream having reduced data-pattern autocorrelations present in the subset of the bit stream relative to the bit stream; and passing the subset of the bit stream to an adaptation engine.

According to yet another aspect of the present invention, there includes an apparatus for reducing data-pattern autocorrelations in digital communication systems, the apparatus including: an adaptation engine for processing a digital stream of bits; and a data subset selection engine formed by a delay block for separating n-bit spaced subsets of the digital stream of bits, where n is an integer; a set of detector blocks for accepting the n-bit spaced subsets of the digital stream of bits; a detector controller for controlling the set of detector blocks to determine bit combinations; and a logic gate for enabling the adaptation engine upon a predetermined output of the set of detector blocks; and wherein the data subset selection engine receives a bit stream; selects a subset of the bit stream having reduced data-pattern autocorrelations present in the subset of the bit stream relative to the bit stream; and passes the subset of the bit stream to the adaptation engine.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
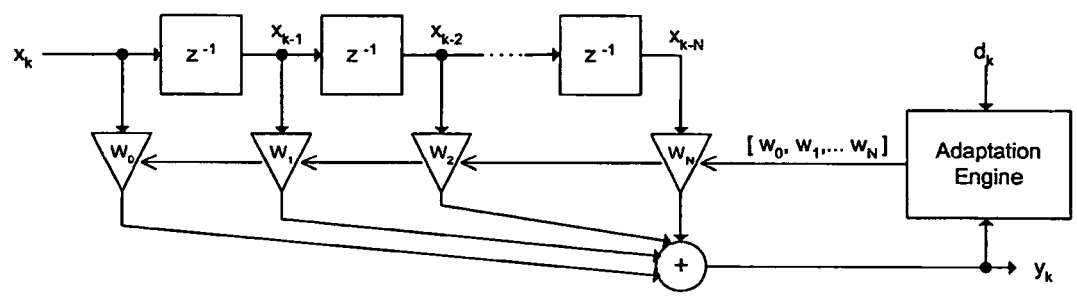
FIG. 1 is a block diagram of an adaptive transversal filter.
Figure 2:
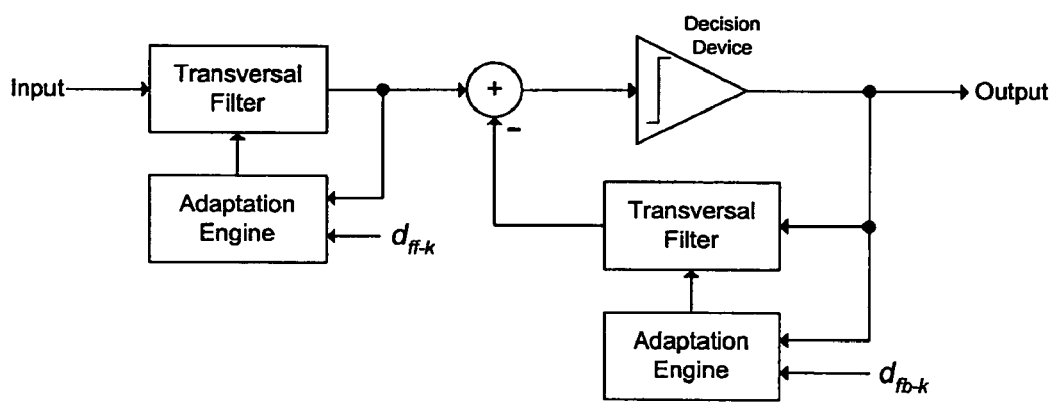
FIG. 2 is a block diagram of an adaptive decision feedback equalizer.
Figure 3:
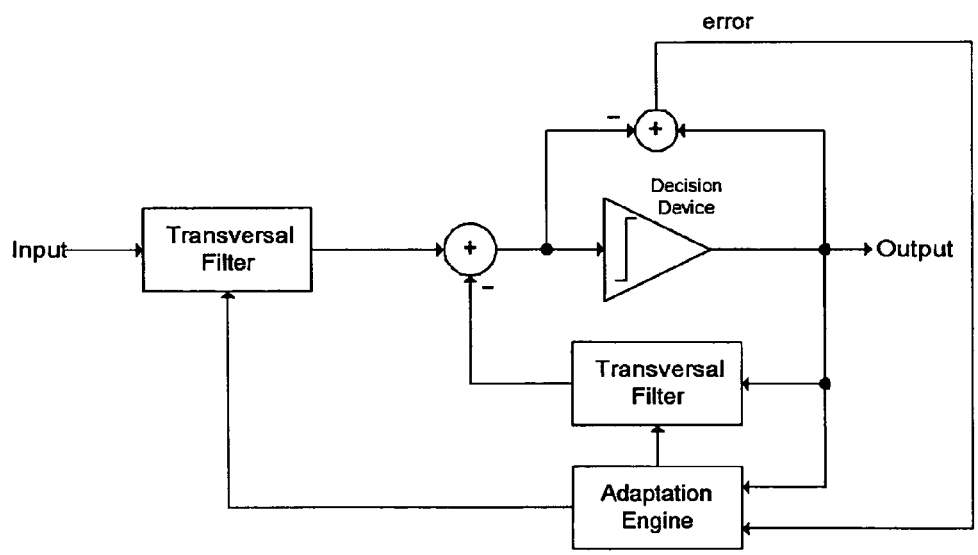
FIG. 3 is a block diagram of a decision-directed decision feedback equalizer.
Figure 4:
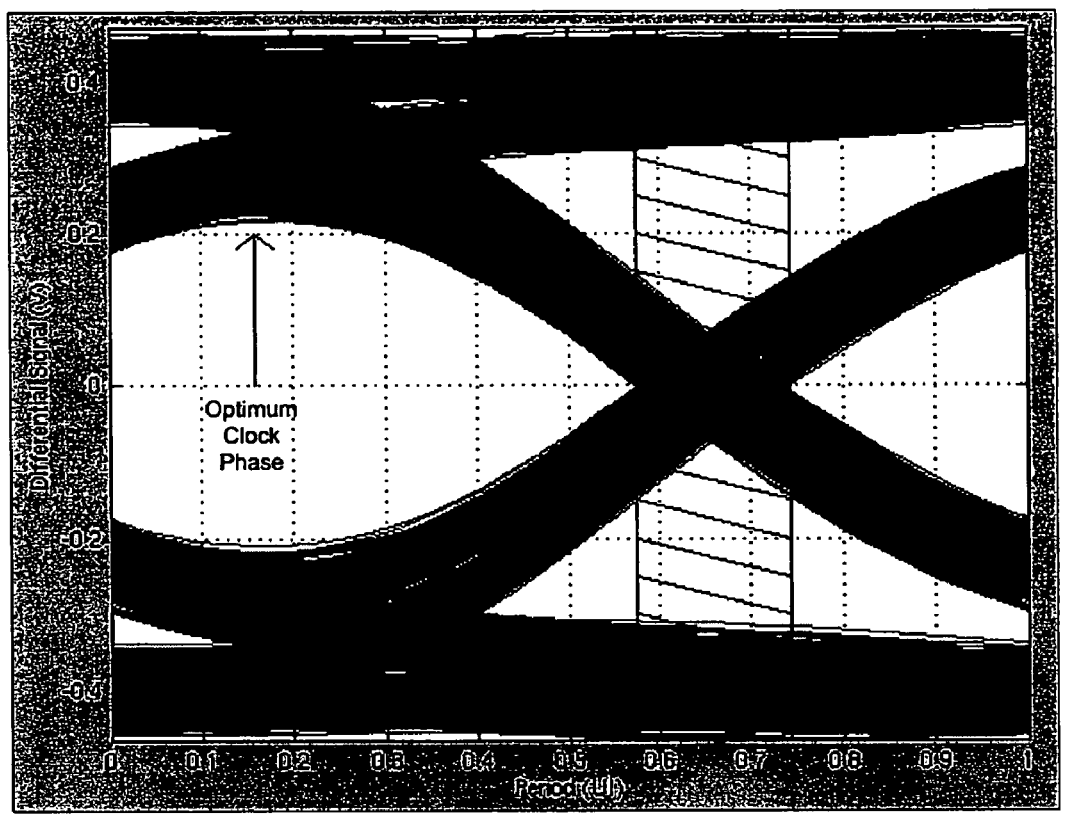
FIG. 4 is an illustration of a received signal eye diagram.
Figure 5:
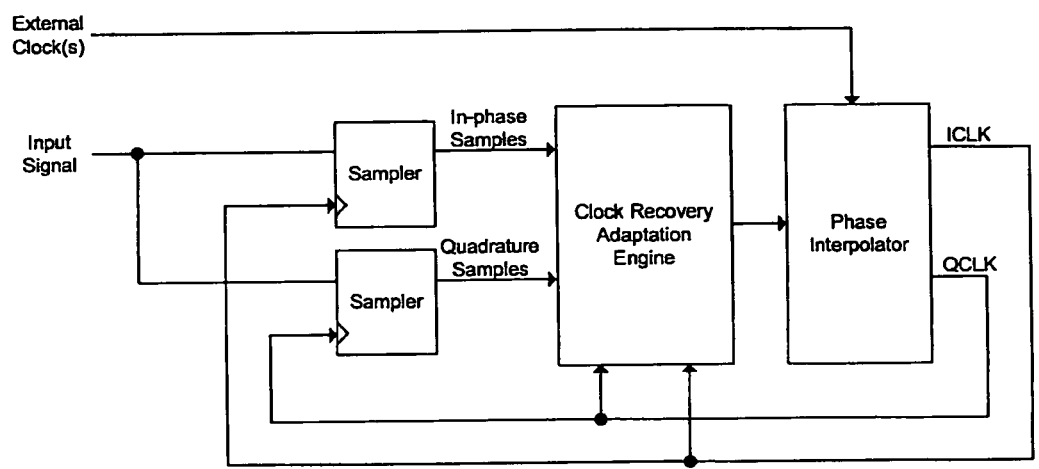
FIG. 5 is a block diagram of a digital clock recovery system.

Generally, the present invention provides a method and apparatus for reducing, and preferably substantially eliminating, data-pattern autocorrelations found in digital communication systems. The novel method employed is referred to as a Data Subset Selection (DSS) method. Autocorrelations in the data-pattern can cause many digital adaptive systems to converge to an incorrect solution. For example, the LMS method, which is often used in adaptive filtering applications, can converge to an incorrect set of filter coefficients in the presence of data-pattern autocorrelations. Digital timing recovery methods are also susceptible. Other impairments that result from data-pattern autocorrelations include increased convergence time and increased steady-state chatter. The DSS method in accordance with the present invention reduces, and preferably substantially eliminates, data-pattern autocorrelations by selecting a subset of the data stream that either demonstrates smaller autocorrelations or no autocorrelations, thus improving the performance of the aforementioned digital adaptive systems.

Embodiments of the present invention can be thought of as a nonlinear filtering of the received data, which can perform substantially perfect whitening with a very small computational overhead. Previous approaches either estimate autocorrelations, or use an imperfect method to achieve de-correlation. At best, they achieve only partial de-correlation. Such methods are also much more complicated.

Traditional digital adaptation methods operate on every bit of the received stream, which may contain harmful autocorrelations. In order to avoid these harmful effects, the present invention provides that a subset of the received bit stream is selected and passed to the adaptation engine according to an embodiment of the present invention. This subset is preferably free of the harmful autocorrelations. However, any reduction in the autocorrelations is beneficial.

A Data Subset Selection (DSS) method according to an embodiment of the present invention and several possible implementations of an apparatus according to an embodiment of the present invention will be discussed. Additionally, two specific examples of its use will be provided. A practical method of selecting an autocorrelation-reduced (or autocorrelation-free) subset from the received bit stream is disclosed. This method involves counting equal numbers of important bit combinations. As a generic example, consider the case in which we define in the conditional probabilities of two bits spaced n-bits apart as:

$P(\text{bit } n+k=+1 | \text{bit } k=+1) = A$ $P(\text{bit } n+k=+1 | \text{bit } k=-1) = 1-A$ $P(\text{bit } n+k=-1 | \text{bit } k=+1) = 1-A$ $P(\text{bit } n+k=-1 | \text{bit } k=-1) = A$   Eqn 20 where $0 \leq A \leq 1$. A=0.5 implies there are no correlations between the two bits (i.e. there is an equal probability of each combination). A≠0.5 implies correlations exist.

If N combinations are examined of two bits spaced n-bits apart, on average one would expect to observe the following counts:

number of (+1,+1) combinations observed=$N*A$ number of (+1,−1) combinations observed=$N*(1-A)$ number of (−1,+1) combinations observed=$N*(1-A)$ number of (−1,−1) combinations observed=$N*A$   Eqn 21

For 0<A<0.5, (+1,−1) and (−1,+1) are observed more often than (+1,+1) and (−1,−1); the reverse is true for 0.5<A<1. To create an autocorrelation reduced (or autocorrelation free) subset, extra observations can be discarded. Thus, for the case 0<A<0.5, the extra (+1,−1) and (−1,+1) observations would be discarded. Within this subset, one can observe an equal number of all four combinations. This is equivalent to having all the conditional probabilities of Equation 20 equal to 0.5. The subset is substantially free of correlations between two bits spaced n-bits apart. This discarding procedure can be applied for any integer value of n desired.

It should be noted that A=0 and A=1 represent degenerate cases in which no transitions are present in the bit stream (the first bit in the stream determines all subsequent bits). These cases result in an empty subset, meaning the adaptation engine stalls because it is starved of fuel. In other words, a lack of suitable input data prevents or slows adaptation. A conventional adaptation method can diverge for these degenerate cases, a much less desirable reaction.

The conditional probabilities given in Equation 20 assume symmetry between +1's and −1's. It is theoretically possible that each of the four probabilities has a different value, which would cause each bit combination to have a different number of observations in a block of size N. The DSS method still operates correctly under this condition: discard the extra observations of three of the combinations instead of only two. The goal is simply to make each combination have an equal number of observations.

Embodiments of the present invention can be used to simultaneously correct all possible correlations (i.e., for $-\infty<n<\infty$). In some embodiments, the method can be limited to correct for a finite number of correlations, reducing rather than completely eliminating the autocorrelations. Typically, values of n can be selected based on their impact on the steady-state solution.

Figure 6:
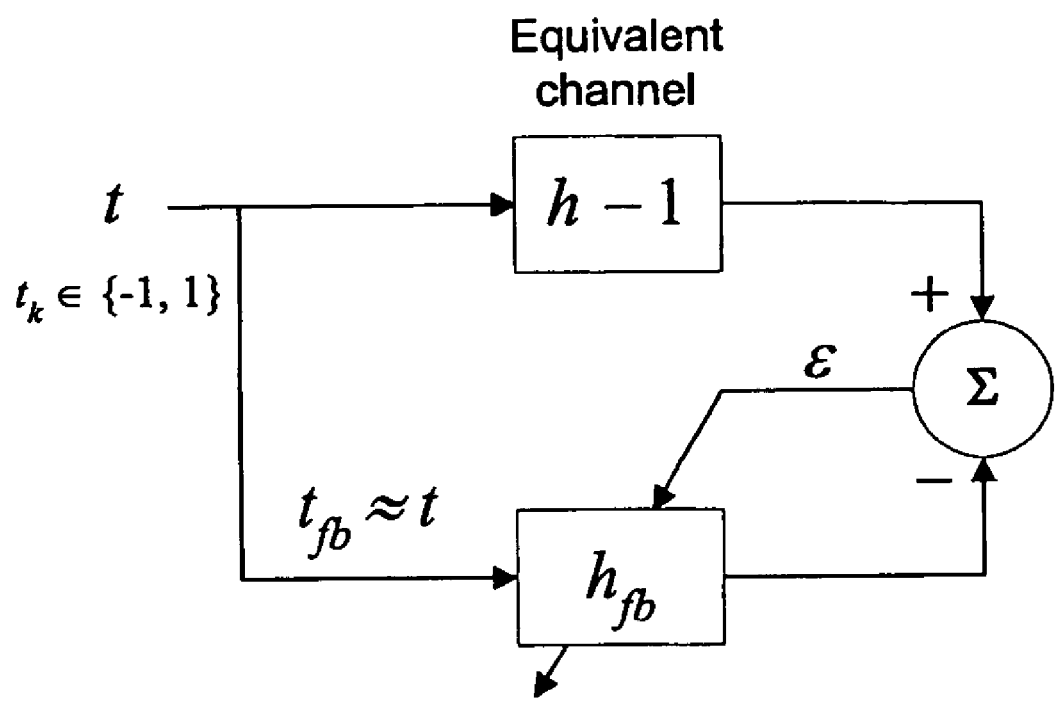
FIG. 6 is an illustration of an equivalent representation of a feedback-only transversal filter DFE in steady state.
Figure 7:
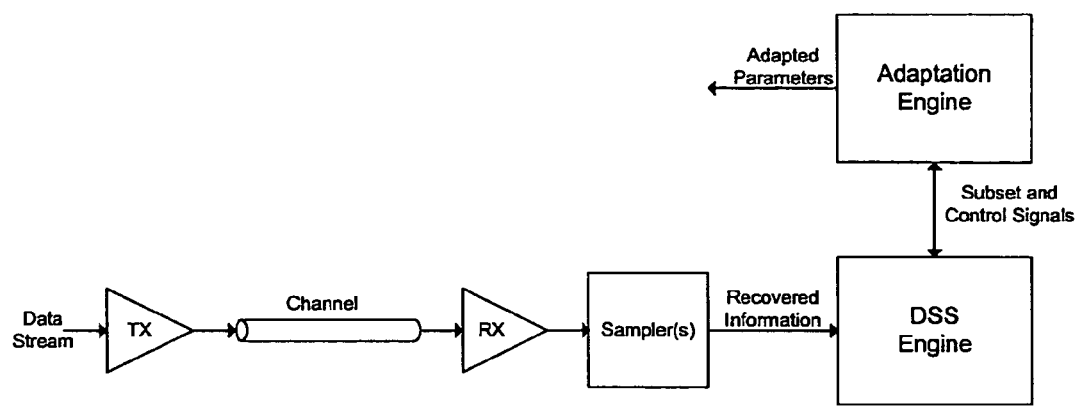
FIG. 7 is an illustration showing a Data Subset Selection Method (DSS) engine according to an embodiment of the present invention in the context of a generic communications system.

FIG. 7 illustrates a generic DSS Engine, which implements a DSS method according to an embodiment of the present invention. The DSS engine is shown inserted into a generic, adaptive, digital communications system. The embodiment shown in FIG. 7 is intended to show the general use of a DSS Engine, and only illustrates a particular embodiment. Two specific examples, further to FIG. 6, will be discussed later.

Figure 8:
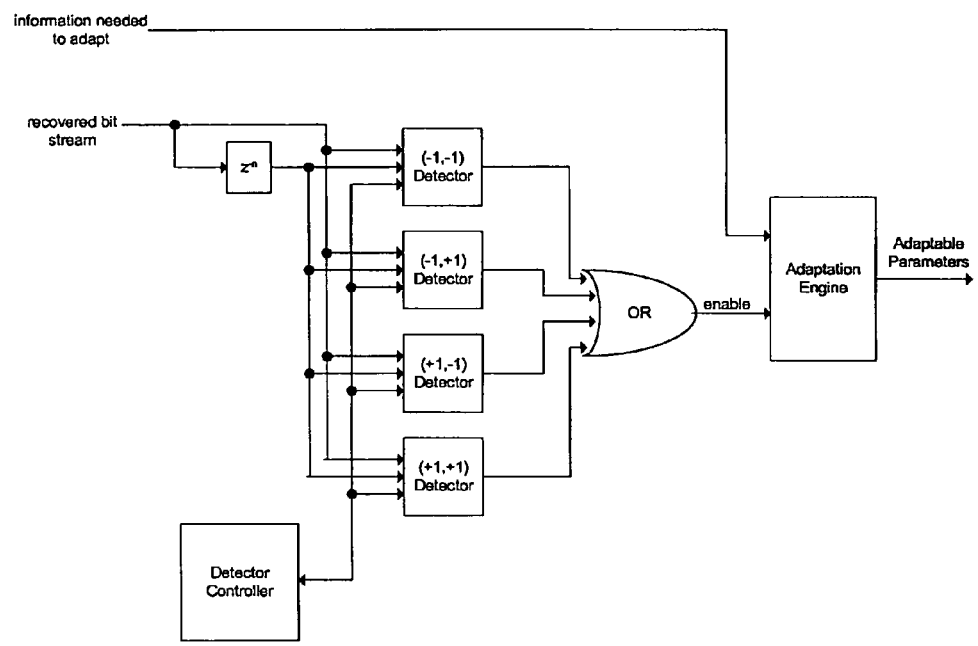
FIG. 8 is an illustration of a DSS engine according to an embodiment of the present invention.

There are many different ways to realize the DSS Engine, ranging in their levels of complexity. The earlier description of the DSS method introduced the concept of a block of data of size N. One could conceive of using a memory element to store a block of information of size N, hunting through that block, extracting the desired de-correlated subset, and passing that subset to the Adaptation Engine. This gives rise to a more complex implementation. A less complex and more efficient implementation is shown in FIG. 8. The implementation shown in FIG. 8 demonstrates an apparatus according to an embodiment of the present invention for correcting autocorrelations for two bits spaced n-bits apart. The n-bit separation is achieved with the z-n delay block. These two bits are passed to the four Detector blocks that determine which bit combination occurred. The outputs of these blocks are logically provided as inputs to an OR gate, generating an enable signal which can turn on the Adaptation Engine.

The computing intelligence of this implementation can be found in the Detector Controller, which controls when the individual Detector blocks can trigger. For example, once a certain Detector block triggers, the Detector Controller can disable it until all other Detector blocks have triggered. In a more complex implementation, the Detector Controller can maintain running counts of the number of times each Detector triggered, and never allow the four counts to deviate from each other beyond a certain limit. Both of these methods lead to the Adaptation Engine operating on equal (or roughly equal) numbers of each bit combination. One can envision many possible implementations of the Detector Controller without straying from the underlying invention presented herein.

The Delay block and the Detector blocks can be duplicated for each bit-spacing to be corrected for. For example, to correct for n=2, 7, and 9, three z-n delay blocks and twelve Detector blocks can be used. It is likely that even for multiple values of n there would remain a single Detector Controller. Without the coordination of a single, master Detector Controller, different values of n could produce conflicting subsets—a single Detector Controller could be used to ensure the selected subset satisfied the requirements of all values of n. Selecting values of n for correction is highly dependent on the application. Other implementations of the DSS Engine are possible. For example, the subset selection process and the Adaptation Engine can be merged for the sake of efficiency.

Embodiments of the present invention include an extension of the DSS Method and Engine to the case in which a set of more than 2 bits is de-correlated. Consider the general case where it is desired to de-correlate a set of m bits (where $2 \leq m < \infty$). In this case, there are $2^m$ possible bit combinations. The method operates as described before, discarding until an equal number of all bit combinations are observed. The apparatus shown in FIG. 7 can be modified in this case to include require m−1 delay blocks, $2^m$ Detector blocks, a more complicated Detector Controller, and an OR gate with $2^m$ inputs.

A more restrictive method of subset generation is provided according to an embodiment of the present invention, in which certain bit combinations are automatically discarded (i.e., never passed through to the Adaptation Engine), while the remaining combinations have their observation counts balanced. This can lead to a more efficient implementation. It can also be beneficial to attach control features to the DSS Engine in some alternative embodiments of this invention. For example, a timeout watchdog can be used to prevent the engine from stalling indefinitely by forcing some appropriate action when a stall is detected. Such appropriate actions might include: resetting all coefficients and re-attempting convergence; adjusting settings of the DSS Engine and re-attempting convergence, raising an error flag that can be read by upstream or downstream blocks, or disabling the DSS engine and re-attempt convergence. Diagnostic features that report the status and performance of the engine can also be implemented, as can user programmability over parameters such as, but not limited to, step-sizes, block-sizes, or running counts.

Figure 9:
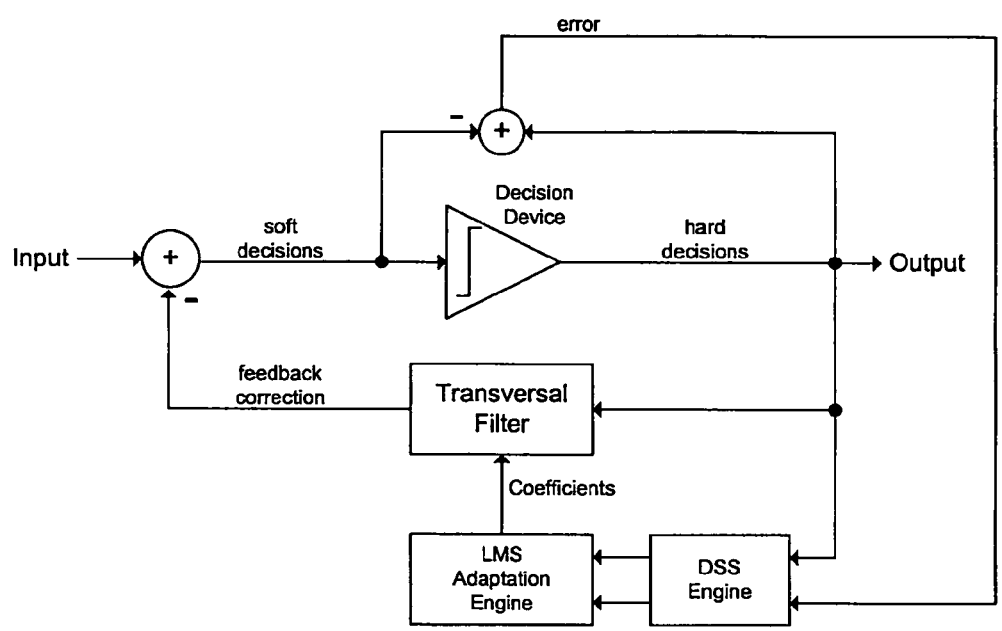
FIG. 9 illustrates an application of a DSS method according to an embodiment of the present invention to a decision directed DFE system.

Embodiments of the present invention can be applied to Non-Return to Zero (NRZ) signalling, Return to Zero (RZ) signalling, multilevel pulse-amplitude-modulation (PAM), duo-binary signalling, Alternate Mark Inversion (AMI) and other modulated digital transmission schemes. Those skilled in the art will also recognize that this method is capable of handling non-stationary autocorrelations. The inventive DSS method can be used to improve the performance of most digital adaptive equalizers operating in the presence of data-pattern autocorrelations. A specific application of the DSS method to a DFE system is illustrated in FIG. 9. This particular DFE is adapted using the LMS method, and functions substantially similarly to the DFE described in the background section, with the exception of the insertion of the DSS Engine. The DSS Engine determines the subset of the error signal and hard decisions that the LMS Adaptation Engine will operate on. From this subset, the LMS Adaptation Engine generates the filter coefficients used in the Transversal Filter.

As described earlier, the uncorrected precursor ISI can cause steady-state errors in the coefficients when data-pattern autocorrelations are present. This is one guide in choosing the bit-spacings, n, for which autocorrelations should be eliminated. For example, to reduce or eliminate the harmful effect of the first-precursor bit on the adaptation of the first post-cursor coefficient, the value n=2 can be included in the DSS Engine.

Figure 10:
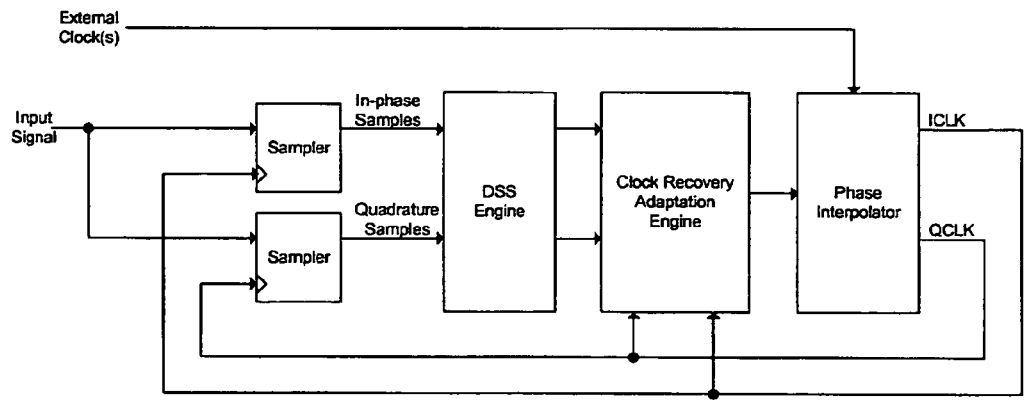
FIG. 10 illustrates an application of a DSS method according to an embodiment of the present invention to a clock recovery system.

The inventive DSS method can be used to improve the performance of most digital clock recovery systems operating in the presence of data-pattern autocorrelations. A specific application of the DSS method to an early/late clock recovery system is shown in FIG. 10. This particular Clock Recovery System functions substantially similarly to the one described in the background section, with the exception of the insertion of the DSS Engine. The DSS Engine determines the subset of the in-phase and quadrature samples that Clock Recovery Adaptation Engine will operate on. From this subset, the Clock Recovery Adaptation Engine generates the filter coefficients used in the Transversal Filter.

As was mentioned earlier, long regions of either high transition density or low transition density can degrade the performance of this system. Thus, values of n can be chosen so as to eliminate or reduce any large deviations in transition density.

With respect to alternative embodiments, an adaptive mechanism can be implemented that automatically selects the values of the bit-spacings, n, to correct for. Because a practical implementation of the DSS method will operate on a finite set of bit-spacings, it is important to choose values for n that yield the most improvement in BER (or some other system measure). This can be challenging for the user to do, so automation would be beneficial.

The extension to spread-spectrum clock recovery applications can also be implemented according to an embodiment of the present invention. Clock recovery systems in spread-spectrum applications often use the same digital methods as non-spread-spectrum applications, and can thereby benefit from DSS.

Figure 11:
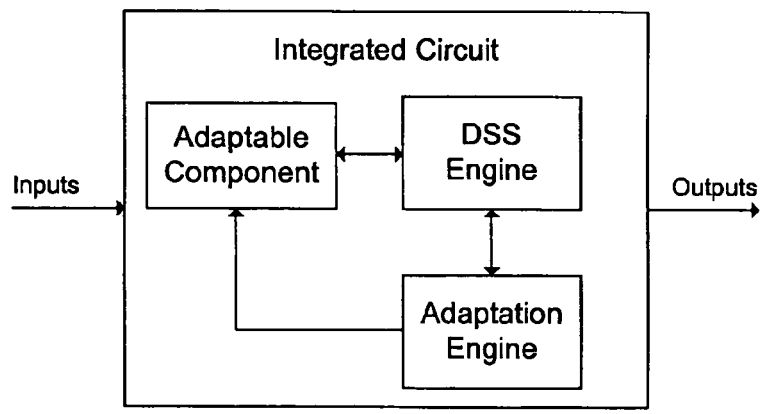
FIG. 11 is a block diagram illustrating a single IC hardware implementation of an embodiment of the present invention.
Figure 12:
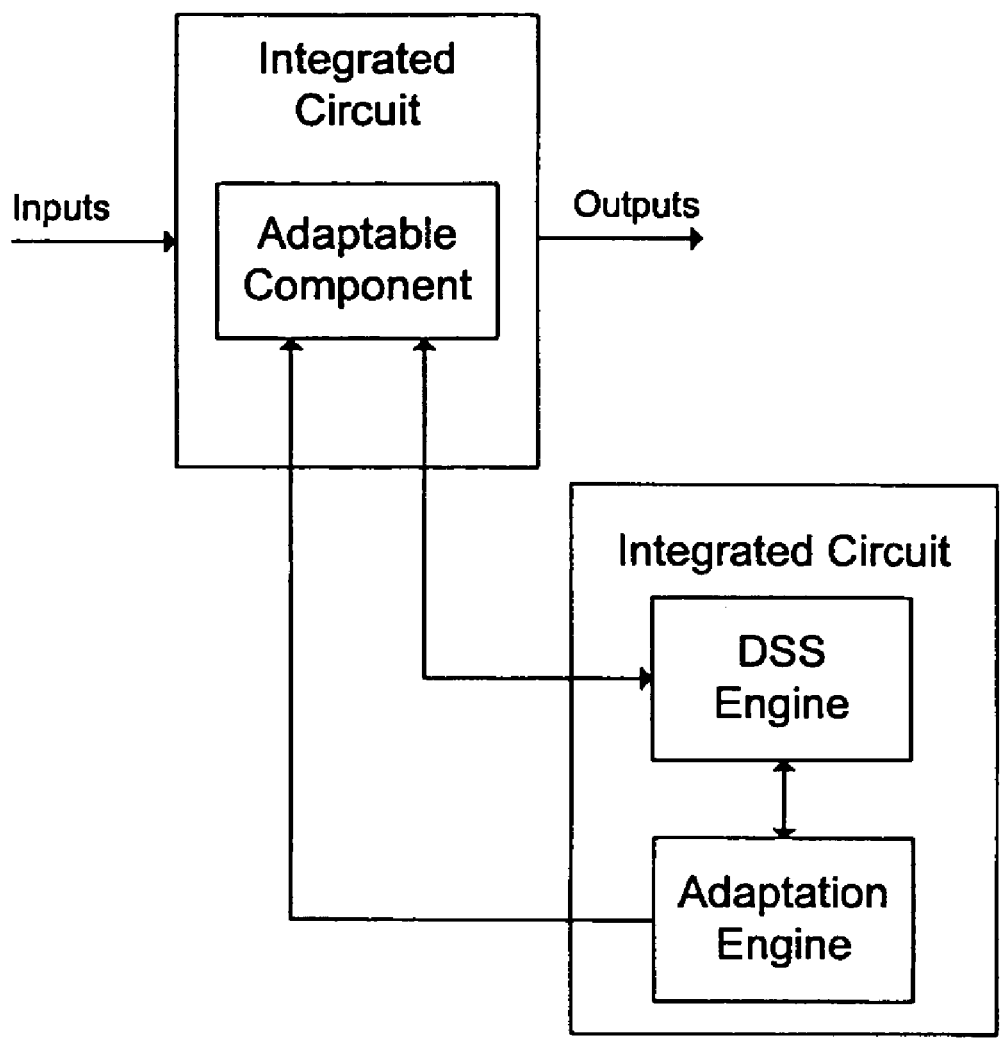
FIG. 12 is a block diagram illustrating a separate IC hardware implementation of an embodiment of the present invention.

FIG. 11 depicts an embodiment of the invention implemented together with the component it is adapting on a single integrated circuit (IC), which could be a Field-Programmable Gate Array (FPGA) or a custom IC. FIG. 12 illustrates another hardware-only embodiment showing how the DSS and Adaptation Engines can be placed on a separate IC from the system component it is adapting, each of which could be an FPGA or a custom IC.

Figure 13:
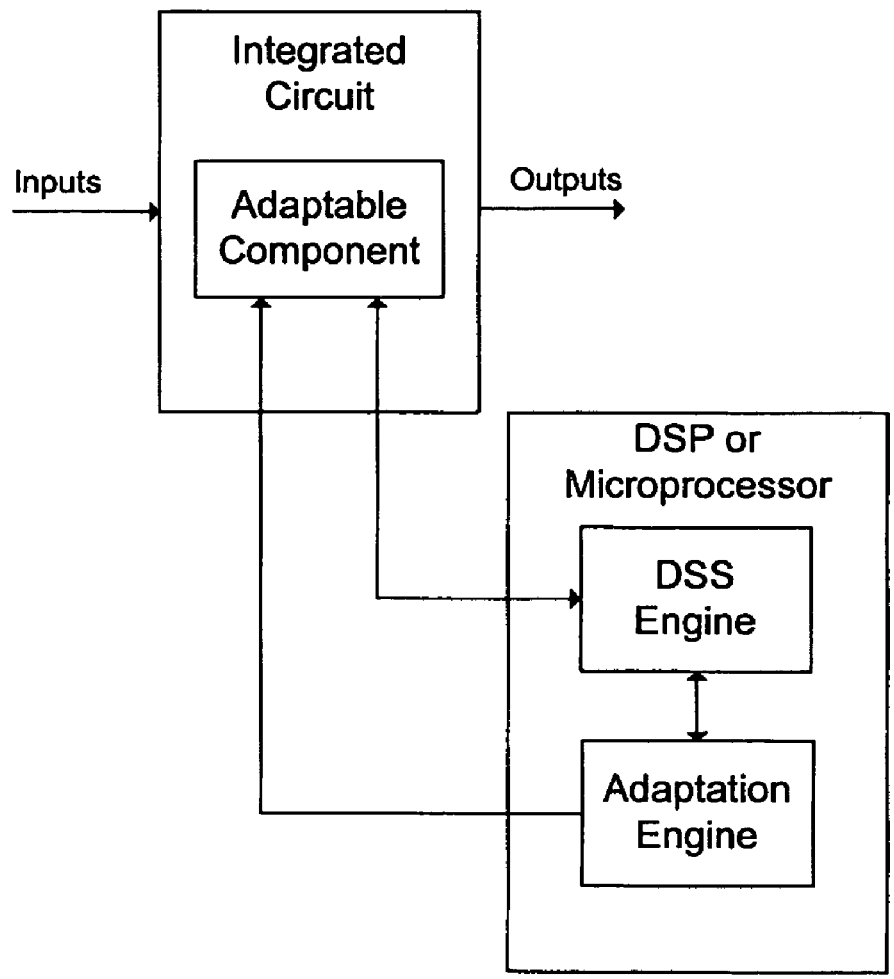
FIG. 13 is a block diagram illustrating a software and hardware implementation of an embodiment of the present invention.
Figure 14:
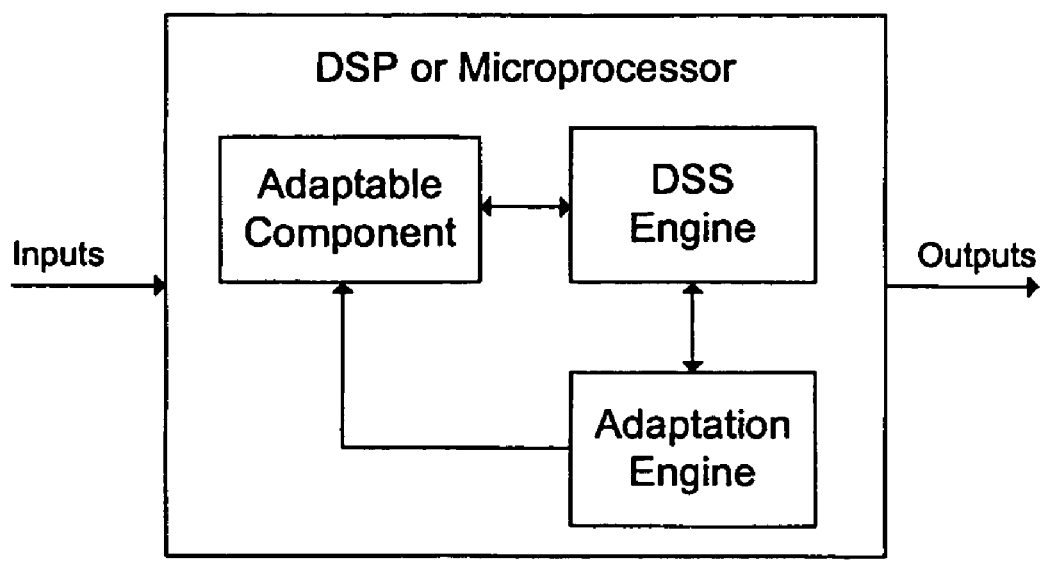
FIG. 14 is a block diagram illustrating a software implementation of an embodiment of the present invention.

There are several other hardware-only combinations according to embodiments of the present invention. For example, separate ICs can be provided for the Adaptable Component, DSS Engine, and Adaptation Engine. FIG. 13 illustrates an embodiment in which the DSS and Adaptation Engines are implemented in software on a digital signal processor (DSP) or microprocessor. In the embodiment of FIG. 14, all three components are implemented in software on a DSP or microprocessor.

Although specific combinations of hardware and software have been described, it is to be understood that embodiments of the present invention can be provided with any combination of hardware and software implementations.

A modified LMS method according to embodiments of the present invention provides a powerful, yet readily implementable tool to help adaptation engines overcome even non-static data-pattern autocorrelations. These autocorrelations are detrimental to the performance of digital communications systems. Providing a generic, low-cost solution to deal with the problem is of commercial significance. In summary, a general subset selection procedure is provided according to an embodiment of the present invention for reducing or eliminating data-pattern autocorrelations in a received data stream. Embodiments include a general DSS Engine as described herein.

Embodiments of the present invention provide the ability to reduce or eliminate autocorrelations between a plurality of two bit combinations of spacing n, where n is an integer in the range $-\infty<n<\infty$. Autocorrelations can be corrected between a plurality of multiple bit combinations (i.e., combinations of more than two bits) with independent, integer-valued spacings between the bits. Certain bit combinations can automatically be discarded (i.e., never passed to the Adaptation Engine). Control features, such as user programmability, can be provided, as can diagnostic features that report the status/performance of the DSS Engine.

A timeout watchdog can be provided to prevent the DSS Engine from becoming stalled by responding with one or more of the following actions: raising an alarm indication on timeout; continuing a best-guess adaptation on timeout despite autocorrelation; putting the DSS Engine to sleep for a certain period of time.

Embodiments of the present invention can be applied to, and used in conjunction with, all types of digital signalling, such as NRZ signalling, RZ signalling, multilevel PAM, duo-binary signalling, and Alternate Mark Inversion (AMI). A best finite set of bit-spacings to correct for can be automatically selected.

Embodiments of the present invention include a DSS method and engine applied to digital adaptive equalizers. Such applications include application to: adaptive DFEs; adaptive transversal filters; and adaptive, digitally-controlled, variable gain amplifiers.

The DSS method and engine according to an embodiment of the present invention can be applied regardless of, or independent of, the method used by the Adaptation Engine of the adaptive equalizer. Some example methods include: LMS, CMA, and specialized versions of LMS like sign-sign LMS.

DSS according to an embodiment of the present invention, including the DSS Method and Engine, can be applied to Clock Recovery Systems. DSS can be used regardless of, or independent of, the method used by the Adaptation Engine of the clock recovery system. One example is a basic early/late method.

DSS according to an embodiment of the present invention can be used in synchronous, plesiochronous, isochronous, and asynchronous digital communication systems. Embodiments of the present invention can also be used in spread-spectrum applications.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of processing a digital stream of bits at a receiver, said method comprising:
   receiving a bit stream at the receiver;
   detecting predetermined bit combinations at n-bit spacings in the bit stream;
   selecting, at the receiver, a subset of said bit stream having reduced data-pattern autocorrelations present in said subset of said bit stream relative to said bit stream by discarding bits of one or more given bit combinations when a number of the one or more given bit combinations exceeds a predetermined limit for the one or more given bit combinations relative to other of the predetermined bit combinations; and
   passing said subset of said bit stream from the receiver to an adaptation engine.

2. The method as claimed in claim 1, wherein said selecting includes reducing said data-pattern autocorrelations between a plurality of two bit combinations of spacing n, where n is an integer in the range n>0.

3. The method as claimed in claim 1, wherein said selecting includes reducing said data-pattern autocorrelations between a plurality of multiple bit combinations with independent, integer-valued spacings between the bits, said multiple bit combinations being combinations of more than two bits.

4. The method as claimed in claim 3, wherein said selecting is controlled by a detection controller that is programmable by a user.

5. The method as claimed in claim 4, wherein said detection controller includes diagnostic features to report status and performance of a data subset selection engine that performs said method.

6. The method as claimed in claim 5, wherein said detection controller further includes a timeout feature to prevent said data subset selection engine from becoming stalled by responding with a predetermined action.

7. The method as claimed in claim 6, wherein said predetermined action includes raising an alarm indication upon timeout.

8. The method as claimed in claim 6, wherein said predetermined action includes continuing a best-guess adaptation upon timeout despite autocorrelation.

9. The method as claimed in claim 6, wherein said predetermined action includes putting said data subset selection engine to sleep for a predetermined period of time upon timeout.

10. The method as claimed in claim 6, wherein said predetermined action includes resetting all coefficients and re-attempting convergence.

11. The method as claimed in claim 6, wherein said predetermined action includes adjusting settings of said data subset selection engine and re-attempting convergence.

12. The method as claimed in claim 6, wherein said predetermined action includes raising an error flag that can be read by upstream or downstream blocks.

13. The method as claimed in claim 6, wherein said predetermined action includes disabling said data subset selection engine and re-attempting convergence.

14. The method as claimed in claim 3, wherein said digital stream of bits is formed by digital signalling selected from a group consisting of: Non-Return to Zero (NRZ), Return to Zero (RZ), multilevel pulse-amplitude-modulation (PAM), duo-binary, and Alternate Mark Inversion (AMI).

15. The method as claimed in claim 3, wherein said selecting is controlled by a detection controller that provides automatic selection of an optimal finite set of bit-spacings for reducing autocorrelation.

16. The method as claimed in claim 3, wherein said method is performed in a receiver.

17. The method as claimed in claim 3, wherein said method is performed in a receiver.

18. The method as claimed in claim 3, wherein said method is used to adapt coefficients of a decision feedback equalizer (DFE).

19. The method as claimed in claim 3, wherein said method is used to adapt coefficients of an adaptive transversal filter.

20. The method as claimed in claim 3, wherein said method is used to adapt coefficients of an adaptive, digitally-controlled, variable gain amplifier.

21. The method as claimed in claim 3, wherein said method is used to adapt coefficients of a clock recovery system.

22. The method as claimed in claim 3, wherein said method is applied to a digital communication system of a type selected from a group consisting of: synchronous, plesiochronous, isochronous, and asynchronous.

23. The method as claimed in claim 3, wherein said method is used to adapt coefficients of a spread-spectrum digital communication system.

24. An apparatus for reducing data-pattern autocorrelations in digital communication systems, said apparatus comprising:
an adaptation engine for processing a digital stream of bits; and
a data subset selection engine receiving the digital stream of bits, the data subset selection engine formed by
a delay block generating an n-bit delayed stream of said digital stream of bits, where n is an integer;
a set of detector blocks accepting said n-bit delayed stream of bits and said digital stream of bits, and detecting predetermined bit combinations from said digital stream of bits and said n-bit delayed stream of bits;
a detector controller controlling said set of detector blocks to detect the bit combinations, and selecting a subset of said digital stream of bits having reduced data-pattern autocorrelations relative to said digital stream of bits by discarding bits of one or more given bit combinations when the number of the one or more given bit combinations exceeds a predetermined limit for the one or more given bit combinations relative to other of the predetermined bit combinations; and
a logic gate passing said subset of said digital stream having reduced data-pattern autocorrelations relative to said digital stream of bits to said adaptation engine;
wherein said data subset selection engine reduces said data-pattern autocorrelations between a plurality of multiple bit combinations with independent, integer-valued spacings between the bits, said multiple bit combinations being combinations of more than two bits; wherein said apparatus is located at a receiver and is formed by a combination of at least one electronic hardware and computer implementable software.

25. The apparatus as claimed in claim 24, wherein said apparatus is used to adapt coefficients of a decision feedback equalizer (DFE).

26. The apparatus as claimed in claim 24, wherein said apparatus is used to adapt coefficients of an adaptive transversal filter.

27. The apparatus as claimed in claim 24, wherein said apparatus is used to adapt coefficients of an adaptive, digitally-controlled, variable gain amplifier.

28. The apparatus as claimed in claim 24, wherein said apparatus is used to adapt coefficients of a clock recovery system.

29. The apparatus as claimed in claim 24, wherein said apparatus is included within a digital communication system of a type selected from a group consisting of: synchronous, plesiochronous, isochronous, and asynchronous.

30. The apparatus as claimed in claim 24, wherein said apparatus is used to adapt coefficients of a spread-spectrum digital communication system.

31. The apparatus as claimed in claim 24, wherein said data subset selection engine reduces said data-pattern autocorrelations between a plurality of two bit combinations of spacing n, where n is an integer in the range n>0.

32. The apparatus as claimed in claim 24, wherein said detection controller is programmable by a user.

33. The apparatus as claimed in claim 32, wherein said detection controller includes diagnostic features to report status and performance of said data subset selection engine.

34. The apparatus as claimed in claim 33, wherein said detection controller further includes a timeout feature to prevent said data subset selection engine from becoming stalled by responding with a predetermined action.

35. The apparatus as claimed in claim 34, wherein said predetermined action includes raising an alarm indication upon timeout.

36. The apparatus as claimed in claim 34, wherein said predetermined action includes continuing a best-guess adaptation upon timeout despite autocorrelation.

37. The apparatus as claimed in claim 34, wherein said predetermined action includes putting said data subset selection engine to sleep for a predetermined period of time upon timeout.

38. The apparatus as claimed in claim 34, wherein said predetermined action includes resetting all coefficients and re-attempting convergence.

39. The apparatus as claimed in claim 34, wherein said predetermined action includes adjusting settings of said data subset selection engine and re-attempting convergence.

40. The apparatus as claimed in claim 34, wherein said predetermined action includes raising an error flag that can be read by upstream or downstream blocks.

41. The apparatus as claimed in claim 34, wherein said predetermined action includes disabling said data subset selection engine and re-attempting convergence.

42. The apparatus as claimed in claim 24, wherein said digital stream of bits is formed by digital signalling selected from a group consisting of: Non-Return to Zero (NRZ), Return to Zero (RZ), multilevel pulse-amplitude-modulation (PAM), duo-binary, and Alternate Mark Inversion (AMI).

43. The apparatus as claimed in claim 24, wherein said detection controller provides automatic selection of an optimal finite set of bit-spacings for reducing autocorrelation.

* * * * *

UNITED STATES PATENT AND TRADEMARK OFFICE
CERTIFICATE OF CORRECTION

| | | |
|---|---|---|
| PATENT NO. | : 7,876,866 B1 | Page 1 of 1 |
| APPLICATION NO. | : 11/339554 | |
| DATED | : January 25, 2011 | |
| INVENTOR(S) | : Matthew W. McAdam et al. | |

It is certified that error appears in the above-identified patent and that said Letters Patent is hereby corrected as shown below:

Column 15, claim 24, lines 57-59, delete "at least one electronic hardware and computer implementable software." and insert therefor -- a combination of electronic hardware and computer implementable software; wherein the combination comprises at least one hardware element. --.

Signed and Sealed this
Thirtieth Day of August, 2011

David J. Kappos
*Director of the United States Patent and Trademark Office*